(12) United States Patent
Chaji

(10) Patent No.: US 11,742,455 B2
(45) Date of Patent: Aug. 29, 2023

(54) IDENTIFYING AND REPAIRING DEFECTS MICRO-DEVICE INTEGRATED SYSTEM

(71) Applicant: VueReal Inc., Waterloo (CA)

(72) Inventor: Gholamreza Chaji, Waterloo (CA)

(73) Assignee: VueReal Inc., Waterloo (CA)

(*) Notice: Subject to any disclaimer, the term of this patent is extended or adjusted under 35 U.S.C. 154(b) by 119 days.

(21) Appl. No.: 17/105,906

(22) Filed: Nov. 27, 2020

(65) Prior Publication Data
US 2021/0359155 A1 Nov. 18, 2021

Related U.S. Application Data

(60) Provisional application No. 62/937,076, filed on Nov. 18, 2019.

(51) Int. Cl.
| | |
|---|---|
| *H01L 33/00* | (2010.01) |
| *H01L 21/66* | (2006.01) |
| *H01L 33/62* | (2010.01) |
| *H01L 25/075* | (2006.01) |

(52) U.S. Cl.
CPC .......... *H01L 33/0095* (2013.01); *H01L 22/22* (2013.01); *H01L 25/0753* (2013.01); *H01L 33/62* (2013.01); *H01L 2933/0066* (2013.01)

(58) Field of Classification Search
CPC combination set(s) only.
See application file for complete search history.

(56) References Cited

U.S. PATENT DOCUMENTS

| | | | |
|---|---|---|---|
| 2016/0217720 A1* | 7/2016 | Chaji | G09G 3/006 |
| 2018/0259570 A1* | 9/2018 | Henley | H01L 33/36 |
| 2019/0214525 A1* | 7/2019 | Behr | H01L 33/62 |

OTHER PUBLICATIONS

International Search Report & Written Opinion dated Aug. 18, 2021; WIPO Application No. PCT/CA2020/051634.

* cited by examiner

*Primary Examiner* — Ratisha Mehta

(57) ABSTRACT

What is disclosed are structures and methods for testing and repairing emissive display systems. Systems are tested with use of temporary electrodes which allow operation of the system during testing and are removed afterward. Systems are repaired after identification of defective devices with use of redundant switching from defective devices to functional devices provided on repair contact pads. Time varying signals coupled to a capacitor are used as well.

11 Claims, 20 Drawing Sheets

IDENTIFYING AND REPAIRING DEFECTS MICRO-DEVICE INTEGRATED SYSTEM

FIELD OF THE INVENTION

The present invention relates to micro device system integration. More specifically, the present disclosure relates to the test and repair of micro-device integrated systems which integrate micro devices before and after integration into the system substrate.

BRIEF SUMMARY

Test and repair of emissive displays including micro devices transferred to the system substrate is very crucial to increase the yield. While using redundant micro devices can increase the yield, it can increase the costs as well. The embodiments below are directed toward enabling easy and/or practical test and repair processes to increase the yield and reduce the cost.

According to one aspect there is provided a method of testing a device on a substrate, the method comprising: connecting a temporary electrode to a floating contact of the device; biasing the device to be tested for different defects; and removing the temporary electrode.

In some embodiments an optical sensor or sensor array is positioned in a direction of light output from the device, the method further comprising: measuring by the sensor or the sensor array the light output from the micro device generating measurements; and characterizing the device and identifying defects with use of the measurements.

In some embodiments, the temporary electrode comprises gel or electrolyte material. In some embodiments, the temporary electrode comprises transparent material which allows light to pass through.

According to a second aspect there is provided a repair structure on a system substrate comprising: a pixel circuit; a repair contact pad; and at least one fuse coupling the pixel circuit to at least one of the repair contact pad and a micro device.

In some embodiments, the fuse is operative to open and disconnect the micro device from the pixel circuit in a case that the micro device is defective. In some embodiments the repair contact pad is shared between the pixel circuit and the micro device and an adjacent pixel circuit and an adjacent micro device.

According to another aspect there is provided a repair structure on a system substrate comprising spare circuits, switching mechanisms for disabling defective circuits and defective devices, wherein the spare circuits are connected to repair pads for receiving spare devices In some embodiments a defect mapping block maps data from defective circuits and devices to spare circuits and spare working devices.

According to another aspect there is provided a method of repairing a system comprising a defective circuit or micro device, the method comprising: identifying the defective circuit or micro device; populating a repair pad corresponding to the defective circuit or micro device with a functional device; connecting the repair pad to a corresponding pixel circuit; disabling the defective circuit or micro device.

According to a further aspect there is provided a method of repairing a system comprising a defective circuit or micro device, the method comprising: identifying the defective circuit or micro device; populating a repair pad corresponding to the defective circuit or micro device, the repair pad associated with a repair circuit; and disabling the defective circuit or micro device.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

DETAILED DESCRIPTION

Figure 1A:
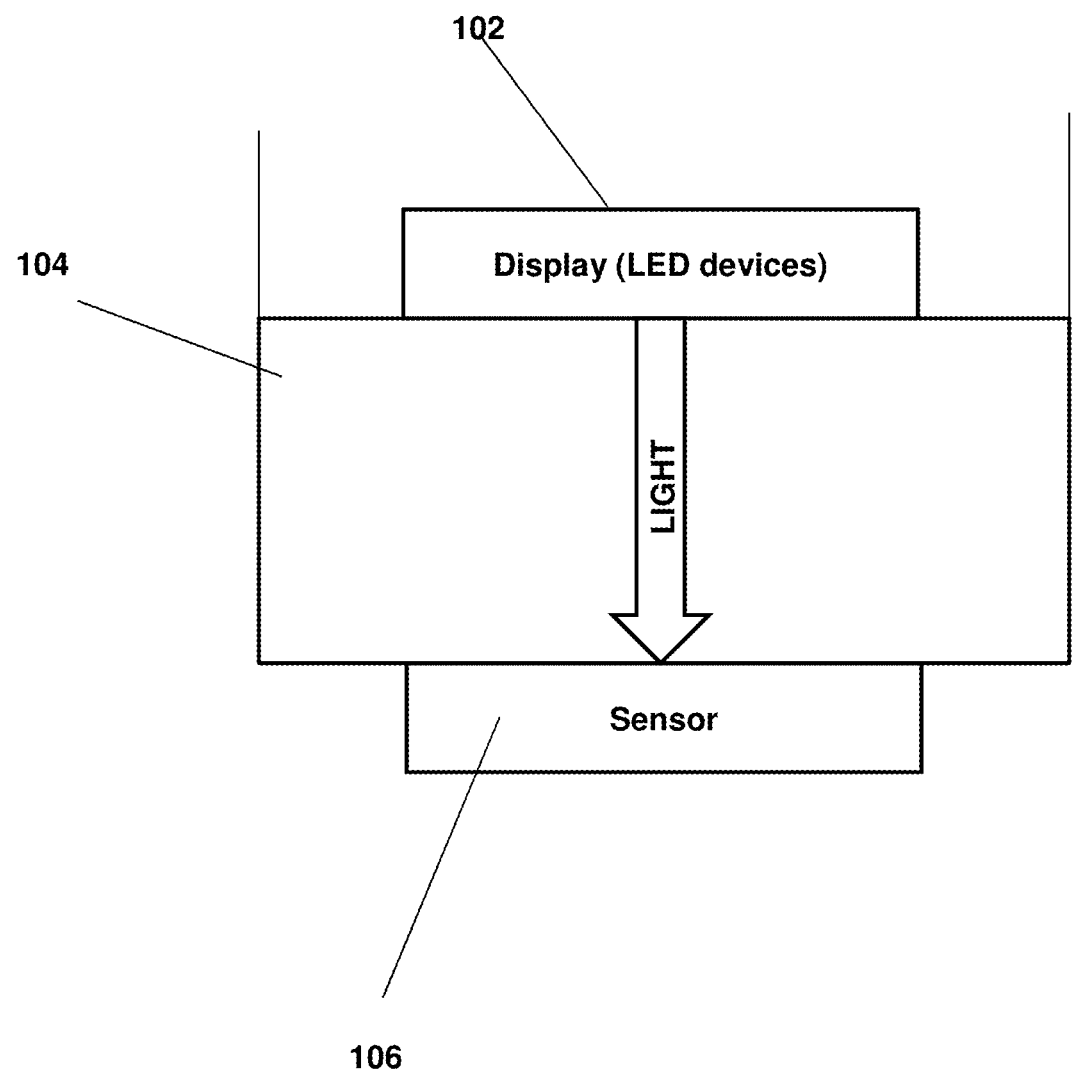
FIG. 1A shows an example of a test structure for identifying defective micro devices in the system or donor substrate.

In micro device system integration, the devices are fabricated in their native ambient conditions, then they are transferred to a larger system substrate. In one case, the micro device is functional after being placed on the system substrate since it has functional connections to the system substrate. In another case, post processing is needed to make the device functional. A common processing step includes creating connections between the micro device and the system substrate, in which case, the system substrate may be planarized first and a thick (1-2 micrometer) dielectric layer is deposited on top of system substrate. If needed, the contact areas to the micro devices are opened by patterning and etching the planarization layer. Thereafter, the electrode is deposited and patterned if needed.

In this description, the term "device" and "micro device" are used interchangeably. However, it is clear to one skill in the art that the embodiments described here are independent of the device size.

The main challenge with such integration is to identify the defective transferred devices and repair them or the emissive display if needed. In the case where no electrode is covering the a micro device element and/or the device has enough connection to the system substrate to be tested, one can easily identify the defect right after the device is put in its place, since the connections to the (pixel) circuit and the main supply voltages are fully formed. The test is not that easy however, when an electrode is deposited for creating a connection after the micro device is put in its place. In this case, at least one of the micro device contacts is floating prior to deposition of the electrode. This is even more challenging if the electrode is a common electrode covering the entire surface of the integrated system. If the electrode is deposited to test the circuit, repairing the damaged device is difficult because the electrode needs to be removed, which can easily damage the rest of the system. If the electrode is not in place, testing the micro devices is difficult due to lack of one or more connections.

Various embodiments in accordance with the structures and processes provided are described below in detail. Included are an external electrode used to bias the transferred devices in the system substrate so that proper tests and verification can be performed, a capacitive coupling structure used to stimulate the transferred devices and extract their parameters and identify the defects, or fuses integrated into the system substrate so that the circuit can be disconnected from the defective micro device. In some embodiments, repair pads are distributed in the system substrate. The pads can be populated with micro device and coupled to the circuit to replace the defective micro device. In other embodiments, spare circuits coupled to repair pads are distributed in the system substrate. The repair pads can be populated with the micro device to replace the defective micro device (or defective circuit). The data to the spare circuits can be connected to the data line of the defective micro device (or defective circuit), or separate data line can be used for the spare circuit. In some applications, a defect mapping block is inserted in the data path to redirect the data related to the defective circuits to their sparse counterparts.

Here, the embodiments are described in the context of pixelated systems (e.g display, sensors, and other array structure), however, similar approaches can be used for other system configurations. Moreover, although the embodiments illustrate techniques applied to micro devices, it is to be understood that they can be applied to any other device size.

In the embodiment illustrated in FIG. 1A, the floating contacts of the micro devices in a partially (or fully) populated system 102 are connected with a temporarily and removable common external electrode 104 (this electrode can be patterned as well to separate rows, columns, or other structures). The same techniques can be used to test the devices on the donor substrate before the transfer process to a receiver substrate, as such reference to micro devices in a system 102 should be understood to equally apply to a donor and to a receiver substrate. The electrode 104 can be made of softer material to provide better contact by applying pressure and to avoid damaging the system substrate. One type of electrode 104 can be formed from conductive polymer materials deposited on a substrate or liquid substances (electrolyte). In another electrode 104 structure, a soft substrate such as plastic or polymer is used and conductive material is deposited on the substrate prior to being connected to the system 102. The deposition can be done by spin coating, printing, sputtering or any other type of deposition technique. In a variation of this embodiment, cantilevers can be fabricated on the substrate of the electrode 104 in the position of contacts to the system or micro device donor substrate.

Figure 1B:
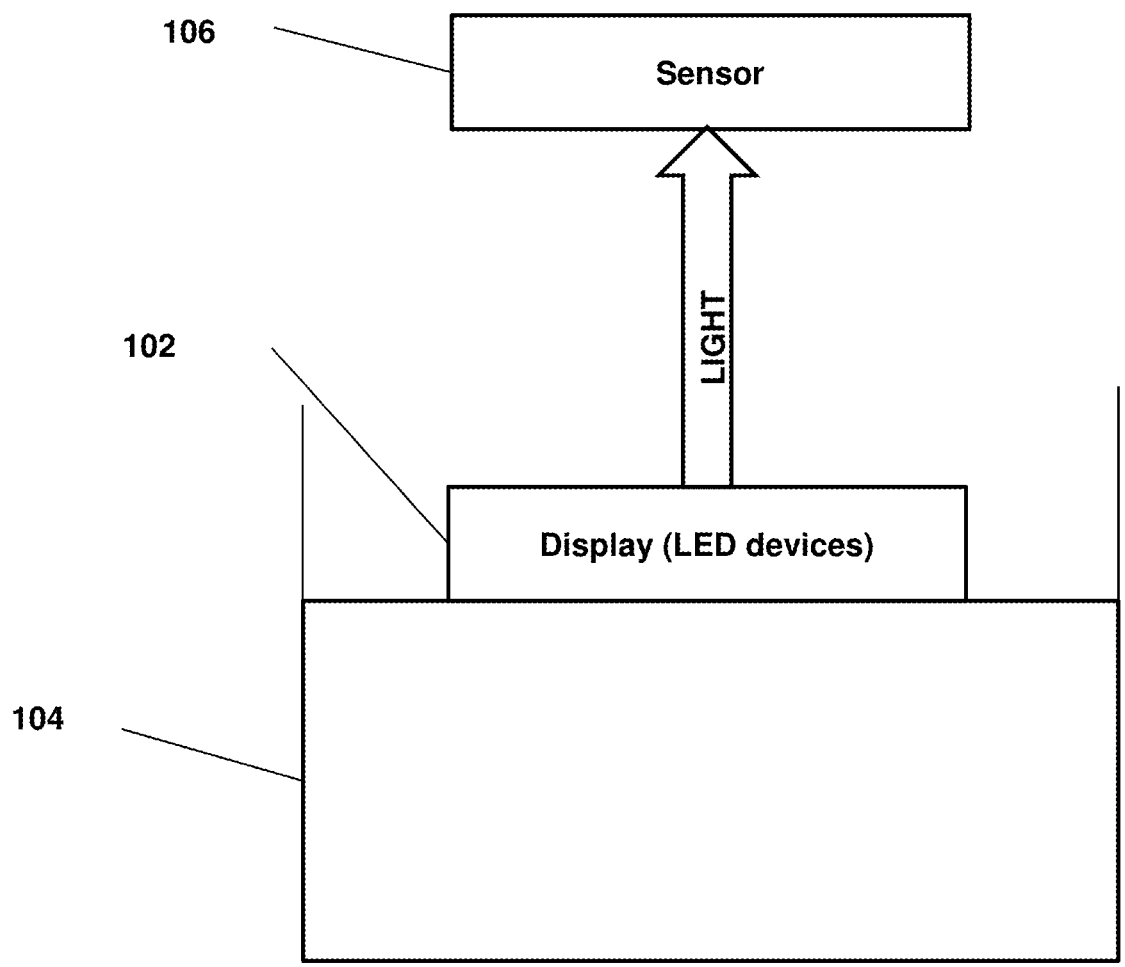
FIG. 1B shows another example of a test structure for identifying defective micro devices in the system or donor substrate.

If the micro-devices are optoelectrical and/or sensor devices, external light sensors 106 and/or exciting (modulating) sources can be used to test the micro-devices. In the case of using external sensors 106 for testing the device, depending on the direction of the light, the sensors 106 are placed either in front of the electrode 104, or on the other side of the system 102. If the light direction is through the electrode 104, transparent material needs to be used for the electrode. FIG. 1B illustrates an embodiment for which the light direction is away from the electrode 104 in which case electrode 104 need not be transparent. In addition to using a light sensor, one can use electrical testing to extract the electrical defect information. It should be noted that although FIG. 1A shows light sensor 106 abutting contact 104, it may be spaced apart from the electrode 104.

After the contact between the electrode 106 and the system substrate (or donor substrate) 102 is established, the circuits are operated to perform different tests such as open-and-short test, uniformity, and functionality test.

Figure 2:
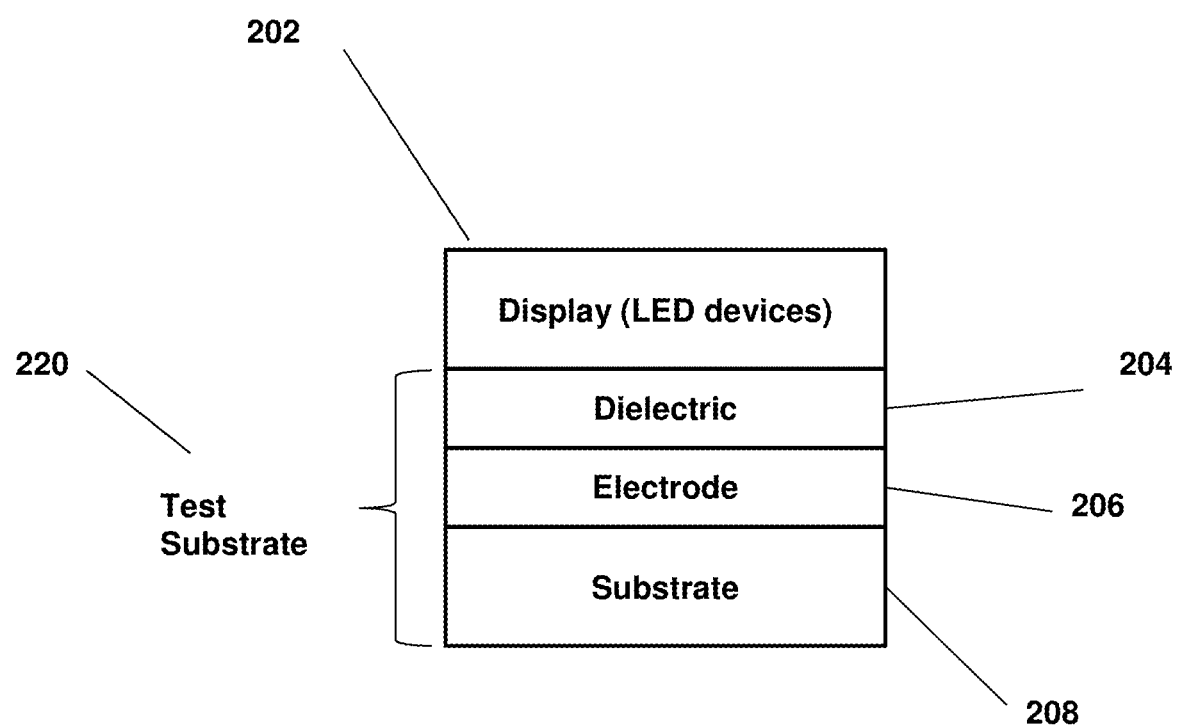
FIG. 2 shows an example of a test structure using capacitive substrate for identifying defective micro devices in the system or donor substrate.

With reference to FIG. 2, in another embodiment, a test substrate 220 made of an electrode 206 and a dielectric layer 204 is used. Here the dielectric layer 204 can comprise a stack of one or more dielectric layers (and an air gap can be the only layer or one of those layers). The electrode 206 can be patterned to separate rows, columns, or other structure. It also can be patterned to form different capacitance structures. FIG. 2 illustrates one example of the position of the test substrate 220 relative to the integrated system (the orientation or the position of the integrated system and test substrate can be changed easily without affecting the results).

Figure 3A:
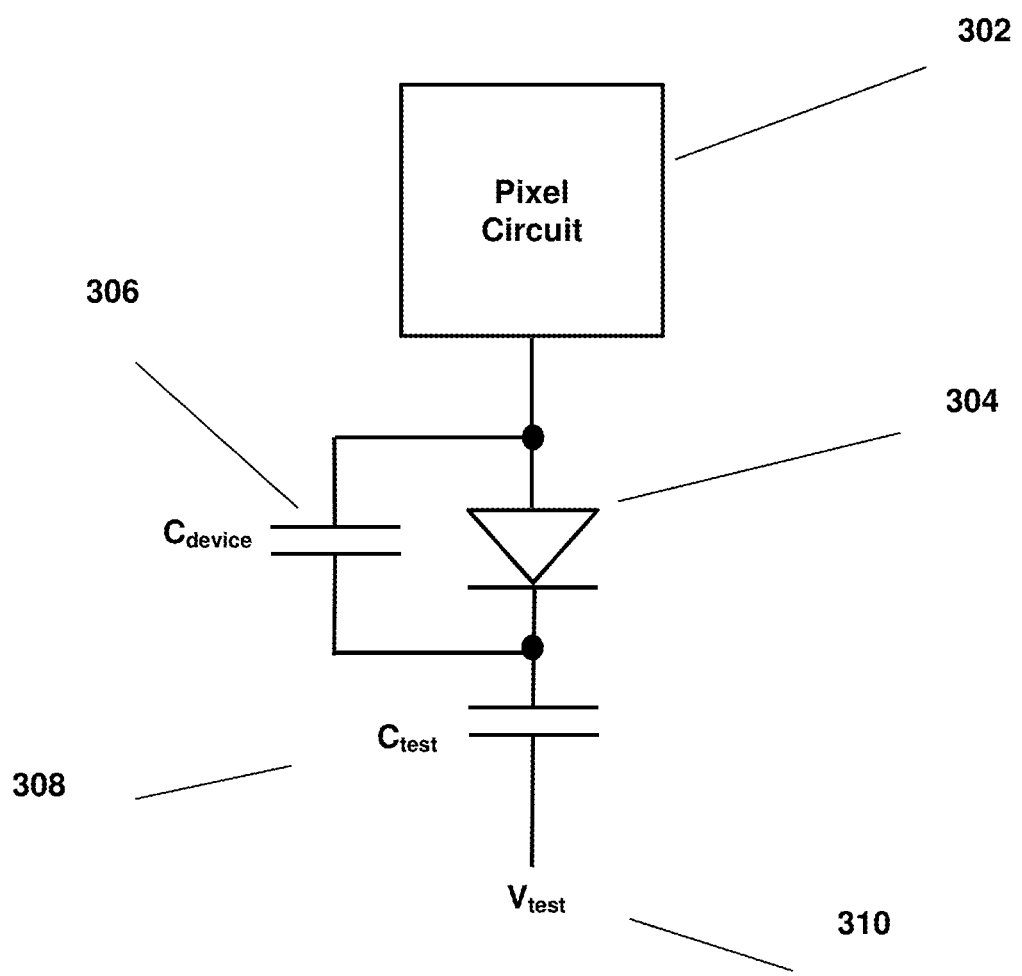
FIG. 3A shows a simplified model of a capacitive coupling test structure for identifying defective devices (or circuit).
Figure 3B:
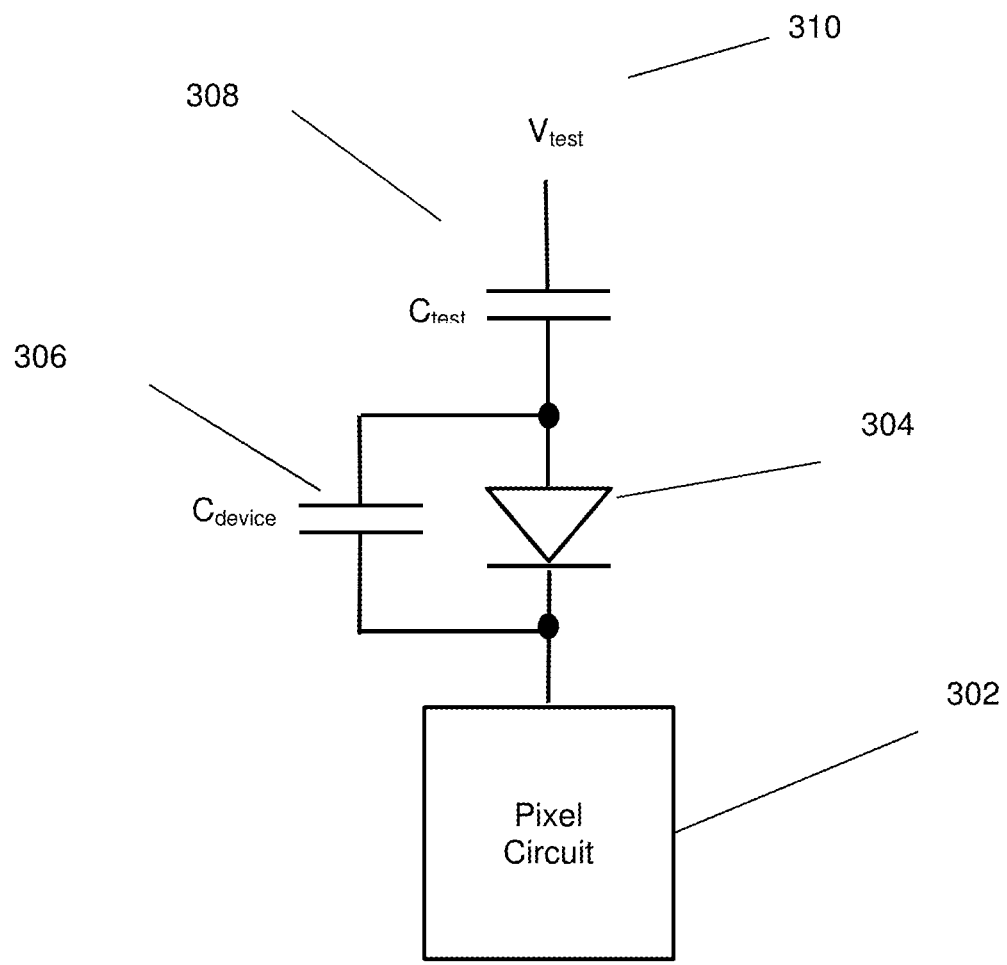
FIG. 3B shows a simplified model of another embodiment for a capacitive coupling test structure for identifying defective devices (or circuit).

FIG. 3A and FIG. 3B are simplified diagram illustrating pixel circuits created by the integrated substrate and the test substrate. In the case of a display system, the micro device 304 can be a light emitting diode and in the case of a sensor system, the device 304 can be a sensor, having an internal capacitance (shown as C (device) in FIG. 3A and FIG. 3B) illustrated explicitly with capacitor 306. Here, one can use a different test setup to measure the micro device performance and detect any defects. In one test, a few different AC signals with known DC bias are applied to the device to extract properties and functionality of its components such as its resistors, capacitors, and test capacitors, among others. In FIG. 3A and FIG. 3B, this is illustrated by test signal $V_{test}$ 310 and test capacitor $C_{test}$ 308. If any of the values of these elements is out of the expected range, it can be attributed to a defect. For example, if the resistive value at the off stage is too low, that means the micro-device is shorted, but if the resistive value at the ON stage is too high, then the device is an open circuit. Also, the capacitive measurement can identify the optical performance of the device. Although the pixel circuits in each of FIG. 3A and FIG. 3B illustrates a device 304 having a particular polarity is to be understood that devices 304 of the opposite polarity are also contemplated.

In another test, for testing an optoelectrical device, a sensor can be used to extract the light generated with AC coupling through the test capacitor such as is illustrated in each of FIG. 3A and FIG. 3B. These data can be used to identify the color uniformity and other optical performance of the emissive device. In another test, an exciting (modulating) source can be used to control the sensor.

After the tests, the defective pixels are identified. The defective pixels either can be fixed or disabled. One way to repair a defect after identification is to remove the defective device from the pixel and replace it with a new one. The main drawback of doing this is the risk that the pixel might be damaged during removal of the defective device.

Figure 4A:
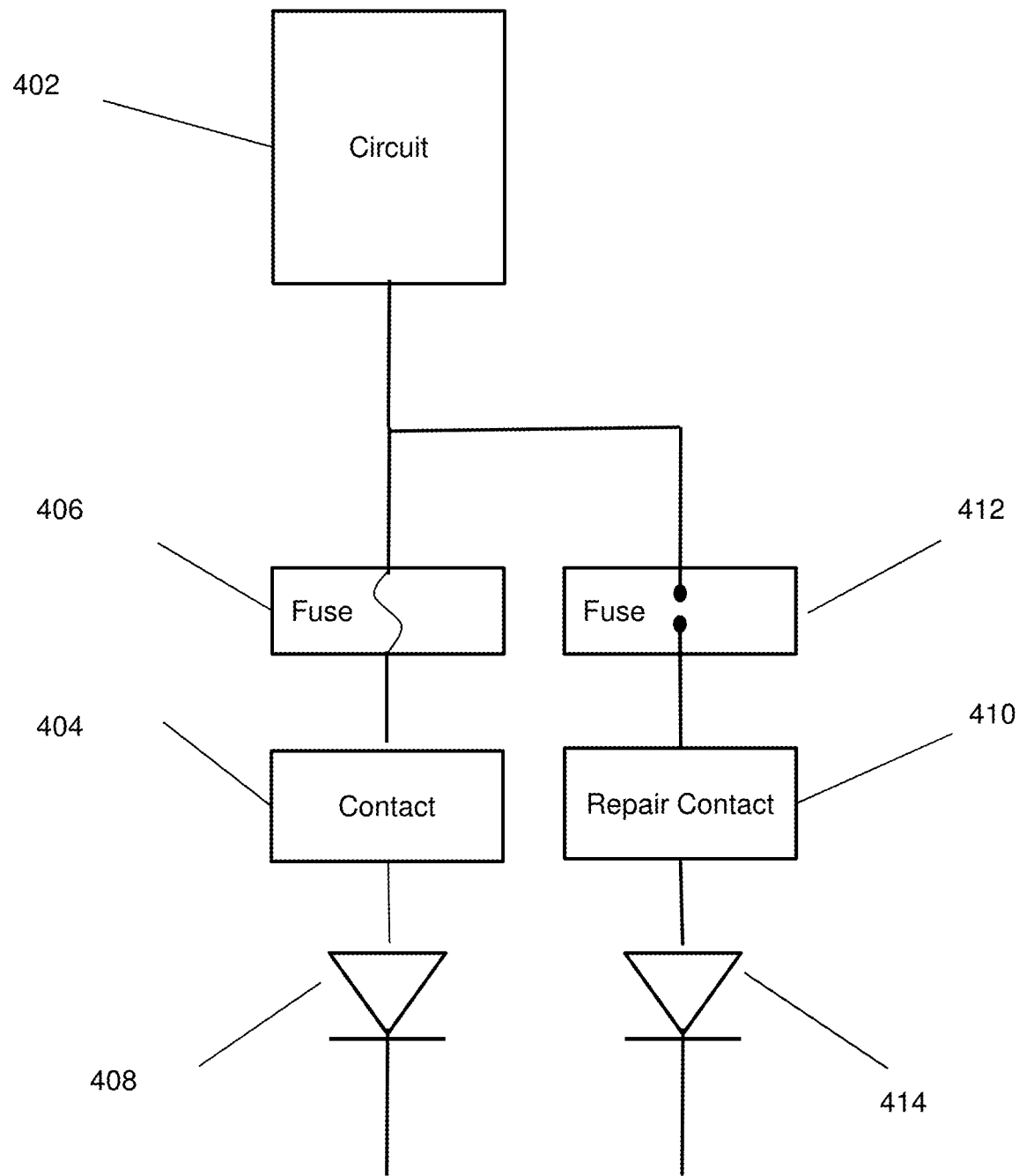
FIG. 4A shows a repair embodiment based on repair pads and fuses for repairing a defective transferred micro device.
Figure 4B:
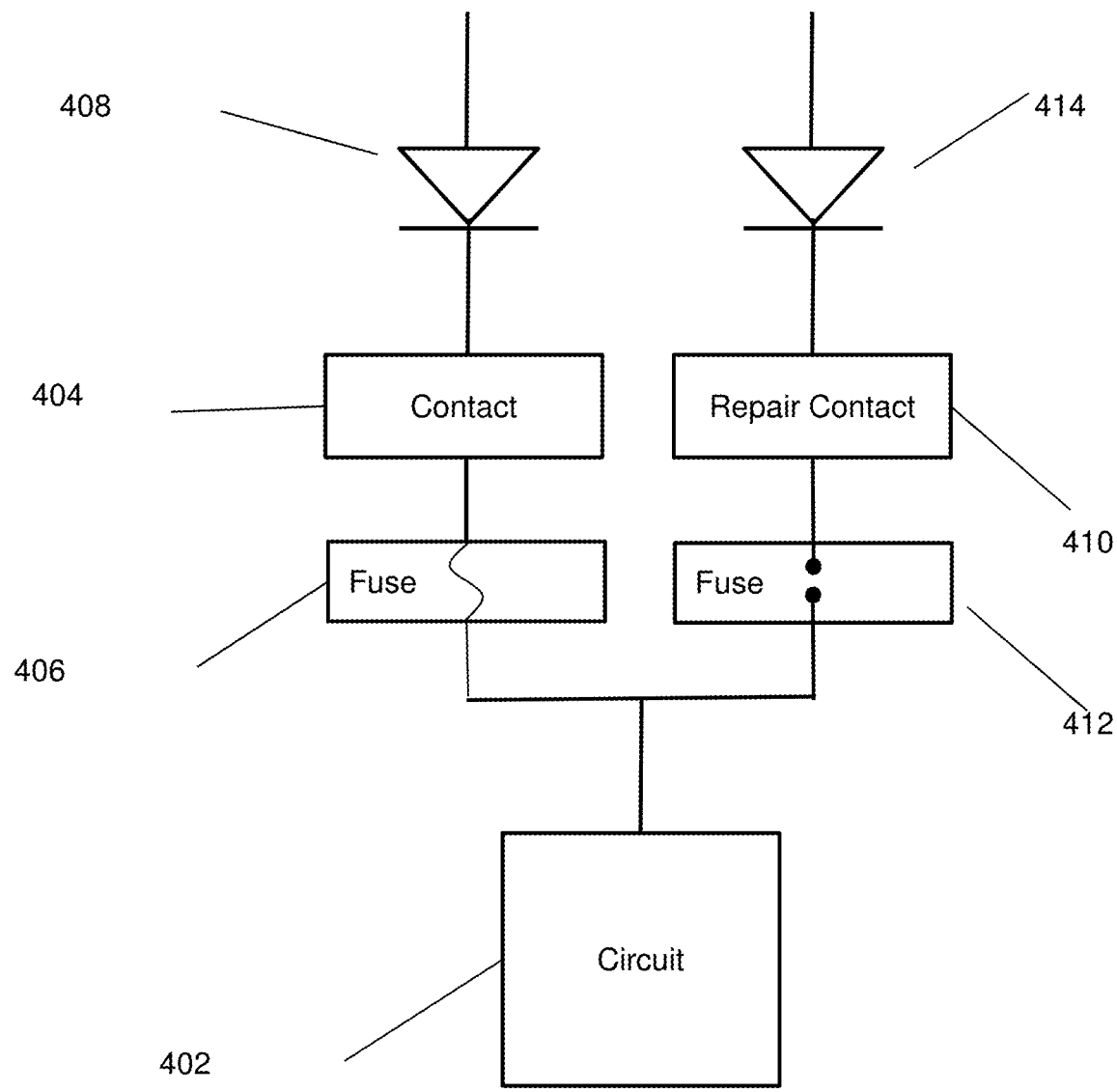
FIG. 4B shows another repair embodiment based on repair pads and fuses for repairing a defective transferred micro device.

In another method illustrated in each of FIG. 4A and FIG. 4B, some extra contact pads 410 (or extension of the main integration pad) are distributed across the panel, and these pads can be used to add new devices 414 to the system. Two types of fuses are used to connect the circuit 402 to the repair pads 410 and the original contact pads 404. Generally open fuses 412 are used to connect the circuit 402 to the repair pads 410 and are not closed or shorted until and unless there is a defect and generally shorted fuses 406 initially for connecting the devices 408 to original devices 408 are blown or opened to disconnect the pixel circuit 402 from the pads 404 of original devices 408 once found to be defective. Fuses which are used for connecting a repair pad to the pixel, can optionally be shared with a few adjacent circuits. These fuses (406, 412) can be activated electrically or by means of a laser. In the electrical activation case, the fuses can be similar or different types of switches that are programmed to be ON or OFF. The repair pads can be directly connected to the pixel circuit, in which case, only the pixel connected to the pad can be repaired. In this case, if the repair pad is not used, it needs to be covered by dielectric before depositing any common electrode (or electrode that may pass over the repair contact) to ensure electrical isolation. The dielectric can be any material including polyamide, silicon nitride, silicon oxide, and other materials. Although the pixel circuits include an original device 408 and a new device 414 each having a particular polarity, as illustrated by FIG. 4A and FIG. 4B, it is to be understood that original devices 408 and new devices 414 of the opposite polarity are also contemplated.

Figure 5A:
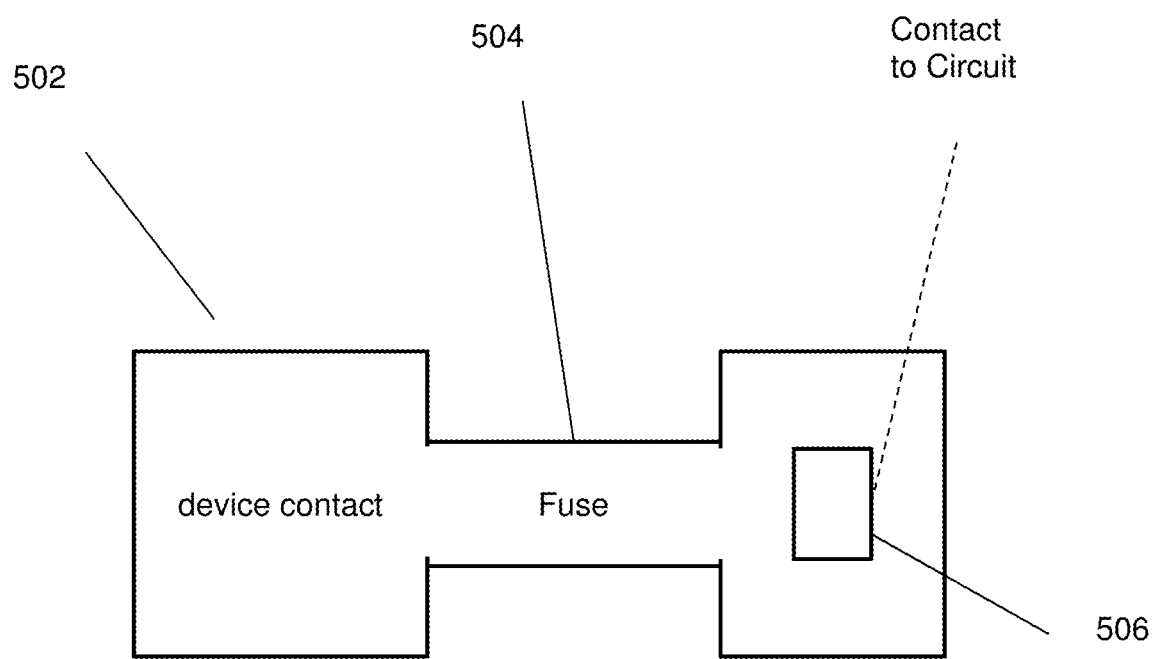
FIG. 5A shows an exemplary implementation of a generally short (closed) fuse for connecting the circuit to the micro device.
Figure 5B:
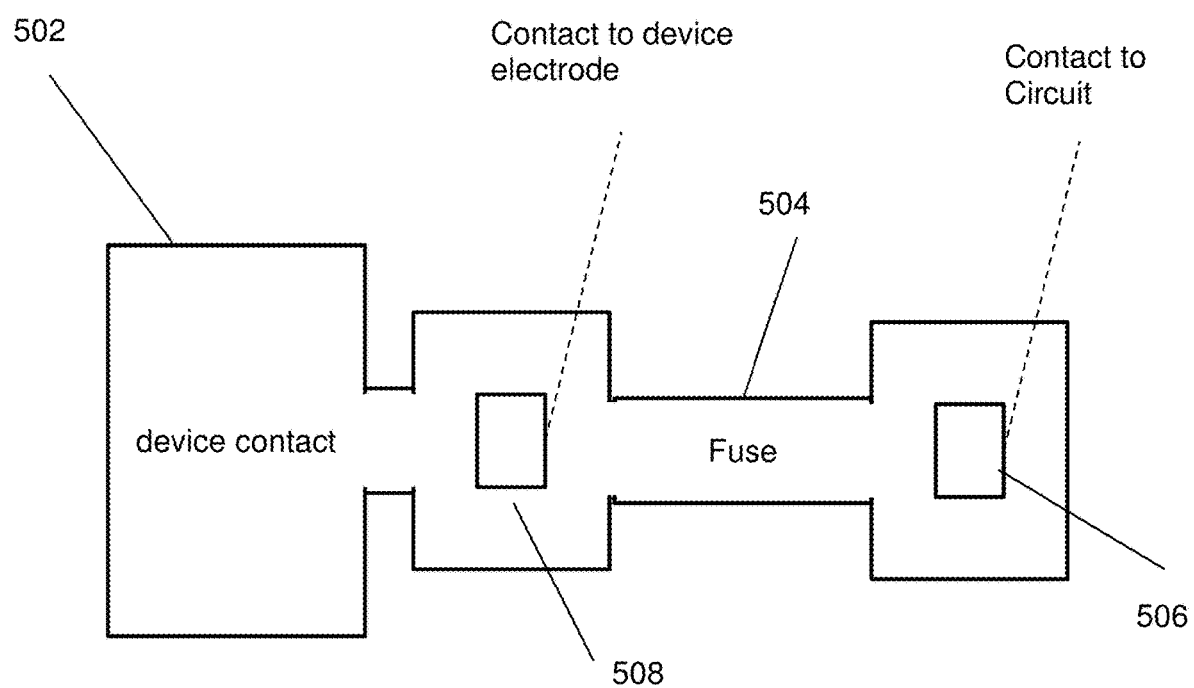
FIG. 5B shows another exemplary implementation of a generally short (closed) fuse for connecting the circuit to the micro device.

FIG. 5A shows an example of a fuse implemented with layer shaping. Here the conductive layer that creates the contacts 502 between the micro device and the circuit is extended into a fuse 504 so that it can be disconnected in the case the device is defective. This can be implemented in other layers and have a different shapes. FIG. 5B shows an implementation of a fuse 504 with a layer that connects the circuit to the micro device contact 502. Also, there can be other layers after or before the layer utilized for the fuse 504. The fuse 504 can be directly or indirectly coupled through other layers connected to the device or circuit. FIG. 5 illustrates the use of a wire fuse 504 that can be burned electrically, by laser, or by other means. FIG. 5A and FIG. 5B show a top view of the fuse 504, the contact to the device 502, and the contact to circuit 506.

Figure 5C:
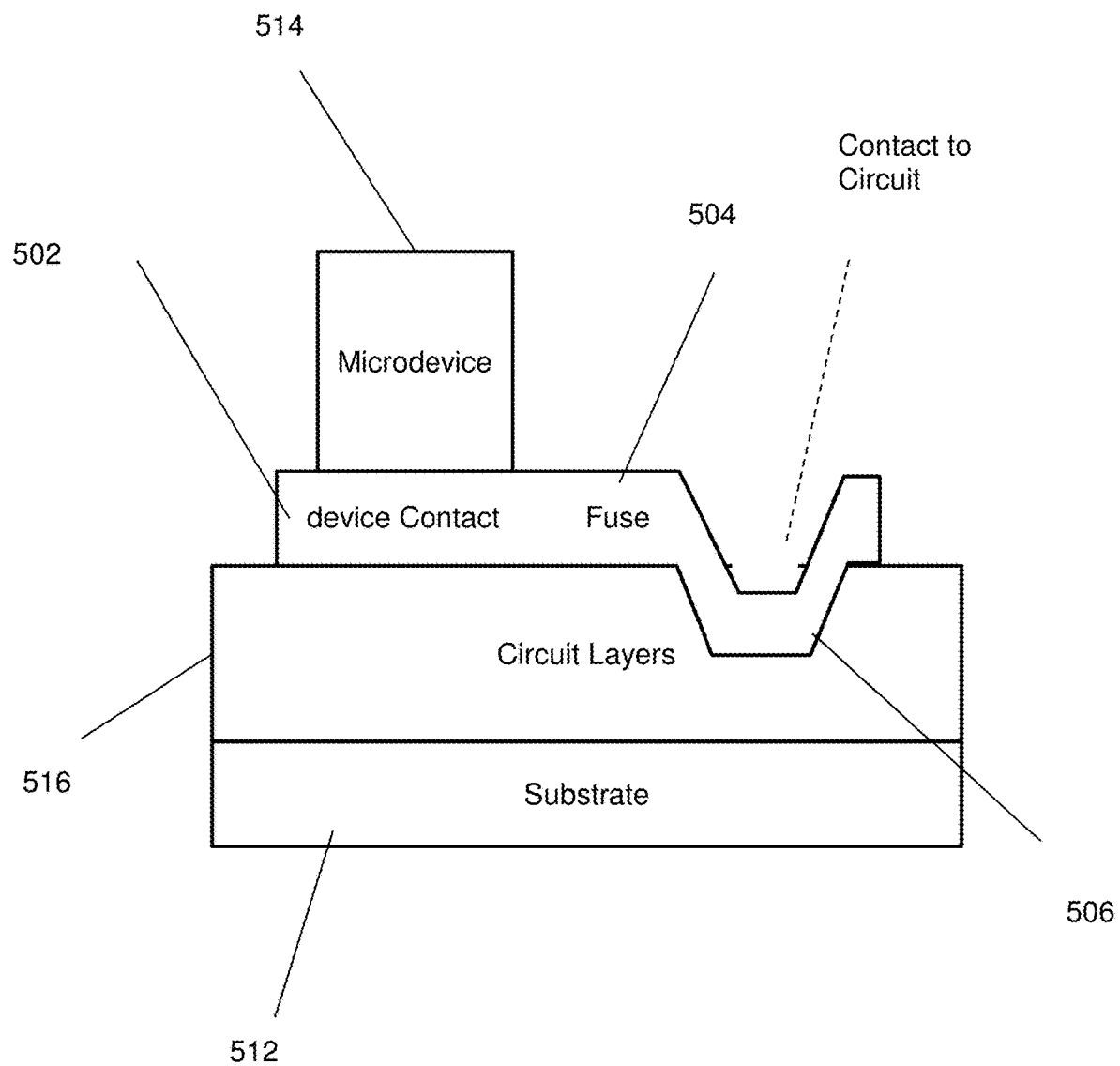
FIG. 5C shows a cross section of an exemplary implementation of a generally closed fuse for enabling a connection between the circuit and a repair micro device.
Figure 5D:
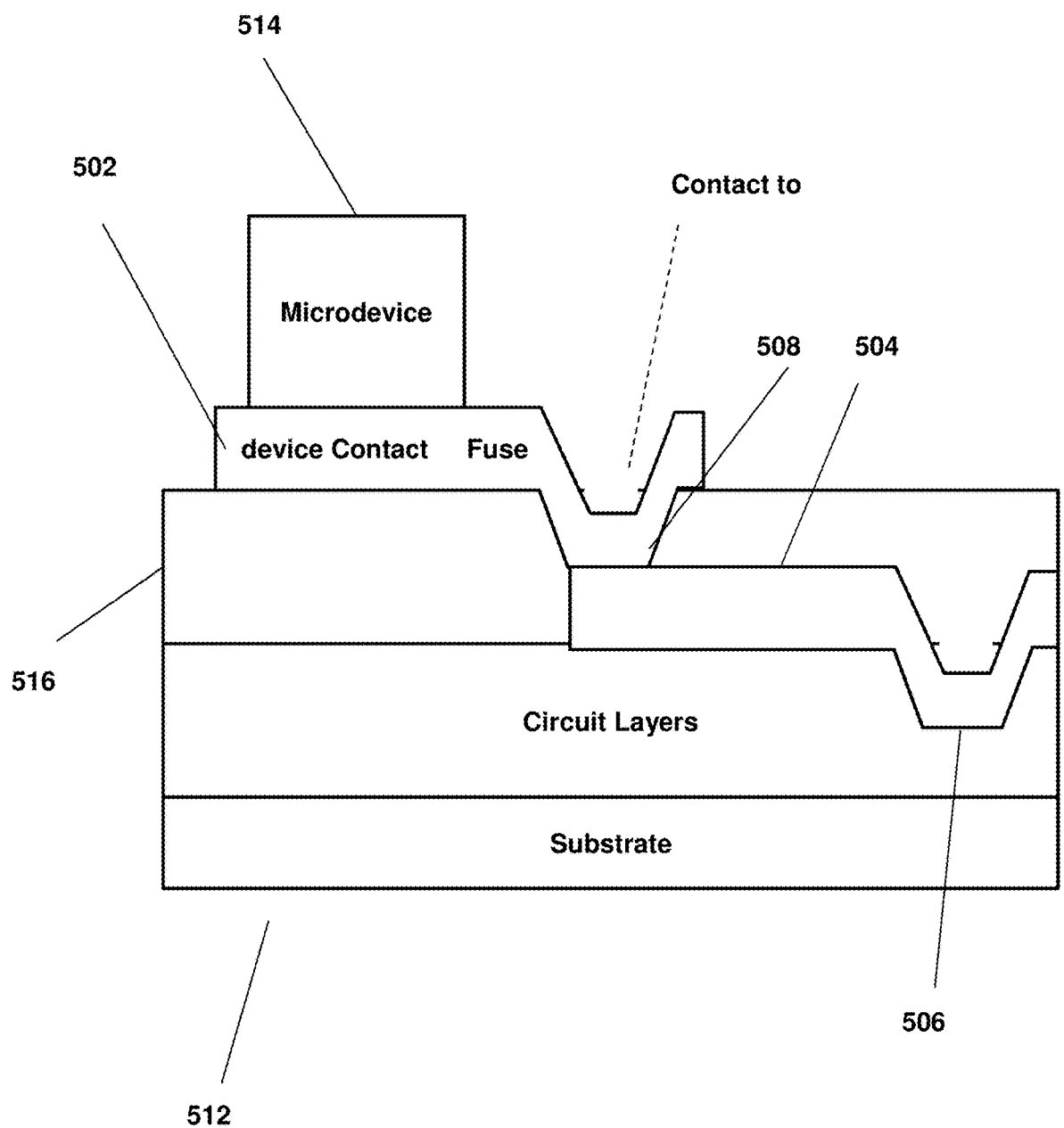
FIG. 5D shows a cross section of a further exemplary implementation of a generally closed fuse for enabling a connection between the circuit and a repair micro device.

FIG. 5C and FIG. 5D show respective cross sections of exemplary implementations of generally shorted (closed) fuses described in FIG. 5A and FIG. 5B respectively. The cross sectional views include the device contact 502, fuse 504, and the contact to the circuit 506. Here the circuit layer 516 is fabricated (or transferred) on the system substrate 512. The contact 506 is formed in the circuit layers 516 to connect the circuit to the device. A fuse 504 is formed by shaping the conductive layer that provides contact to the micro device 514. The fuse can also be created in circuit layers 508. Here, other dielectric layers may exist above the fuse. The circuit layer 516 can include different components to drive the micro device 514 and it can include different conductive and insulator layers. In FIG. 5D, the device 514 is not directly connected to fuse 504. The fuse 504 connects the circuit layer 516 to the micro device through another conductive layer 508. In both FIG. 5C and FIG. 5D, substrate 512 can be transparent.

Figure 6:
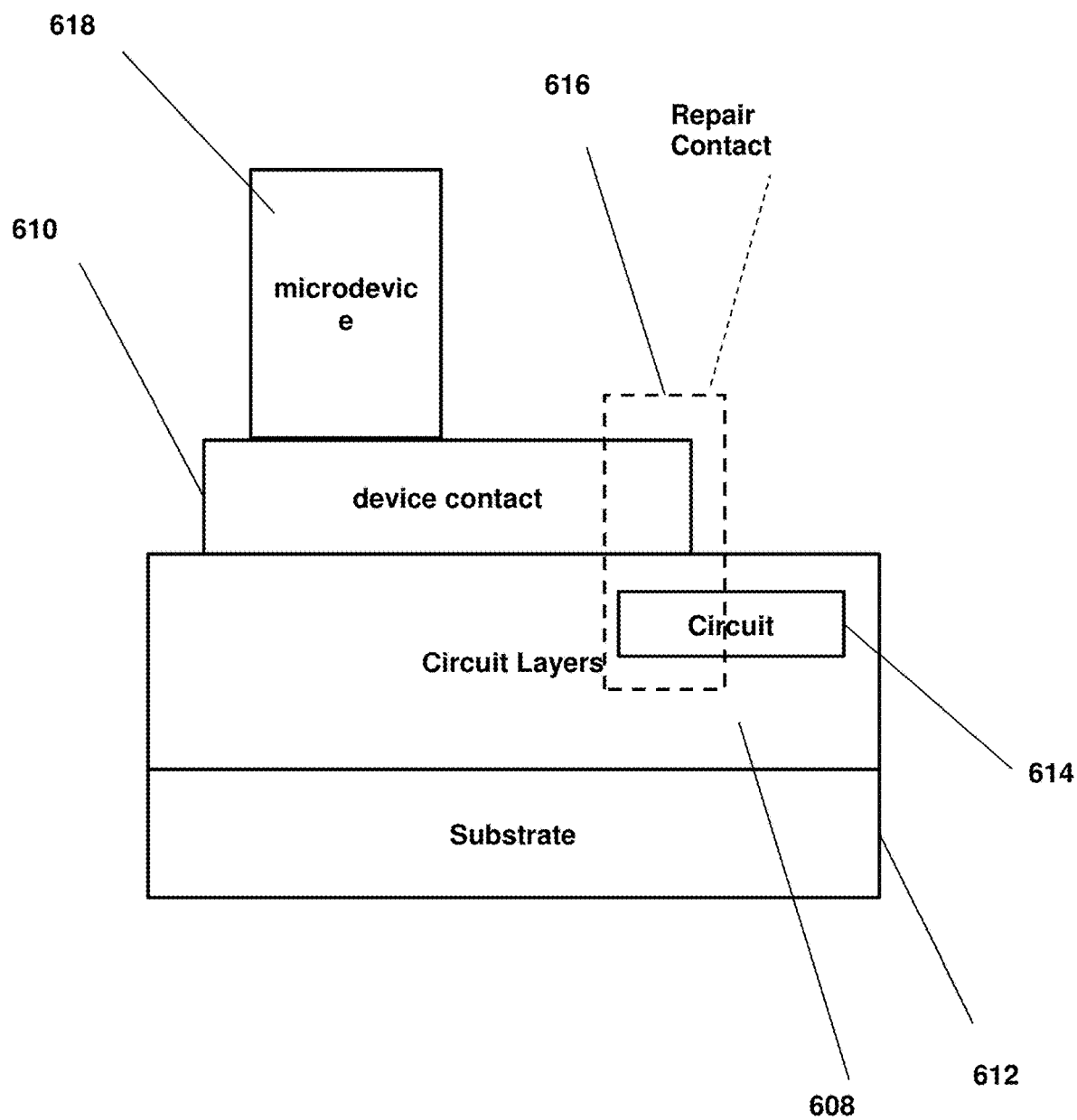
FIG. 6 shows an exemplary implementation of a generally open fuse for enabling a connection between the circuit and a repair micro device.

An example of a generally open fuse 616 is demonstrated in FIG. 6. The cross section includes device 618, device conductive layer 610, fuse 616, circuit contact 614, circuit layers 618, and substrate 612. Here two metal layers 610 and 614 (or other conductive layers) cross each other. The first metal is connected (coupled) to the circuit 614 the other one 610 is connected (coupled) to the repair device contact. The two layers can be shorted by various means such as laser, focused ion beam, or other means.

In another embodiment, if the circuit has an issue, the device can be connected to another pixel circuit. The pixel circuit will be controlled by the same signal as the circuit connected to it. Although, it reduces the defect error, it will not be a complete fix for circuit defects.

Figure 7A:
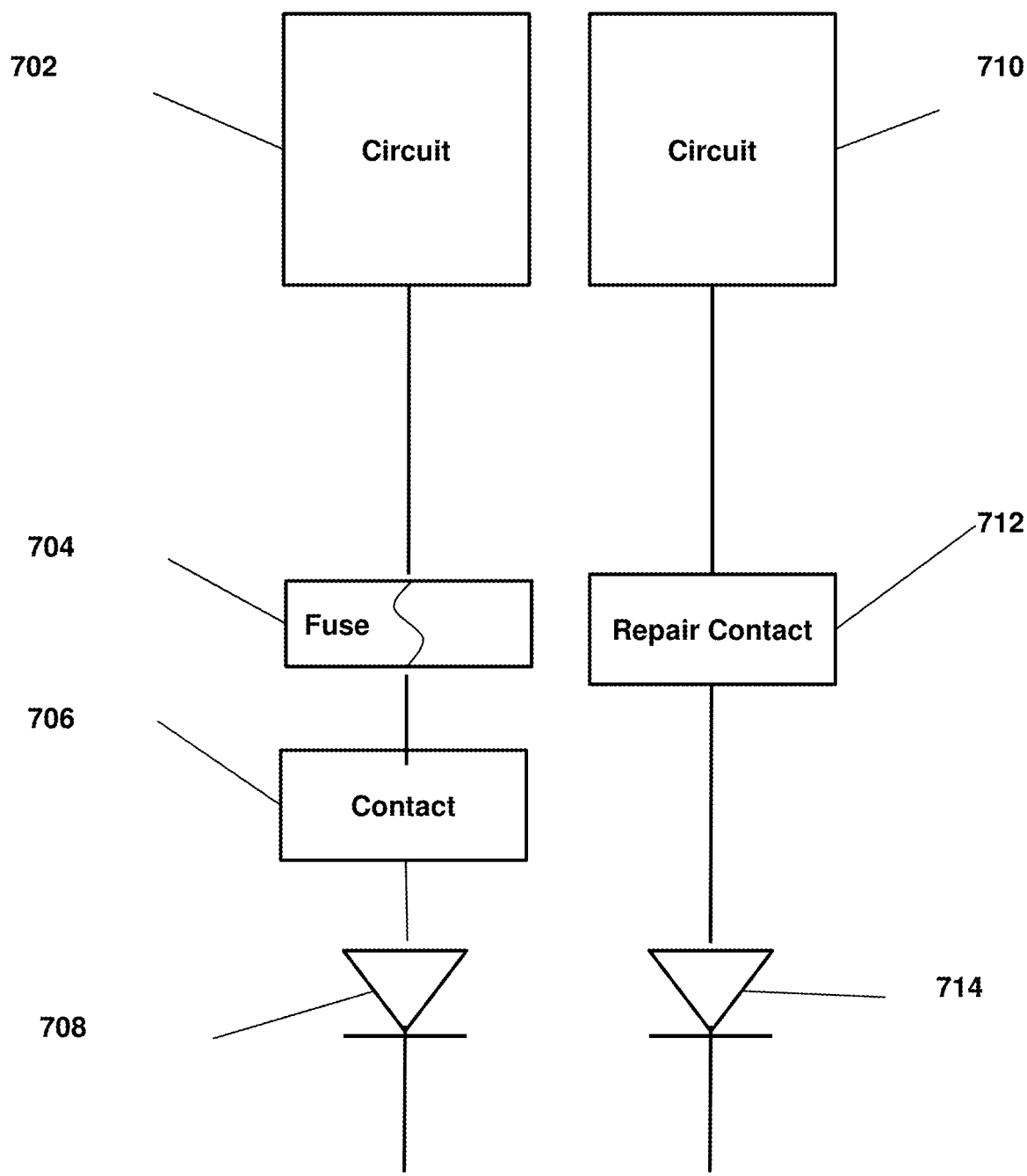
FIG. 7A shows a repair embodiment based on a spare circuit and repair pads.
Figure 7B:
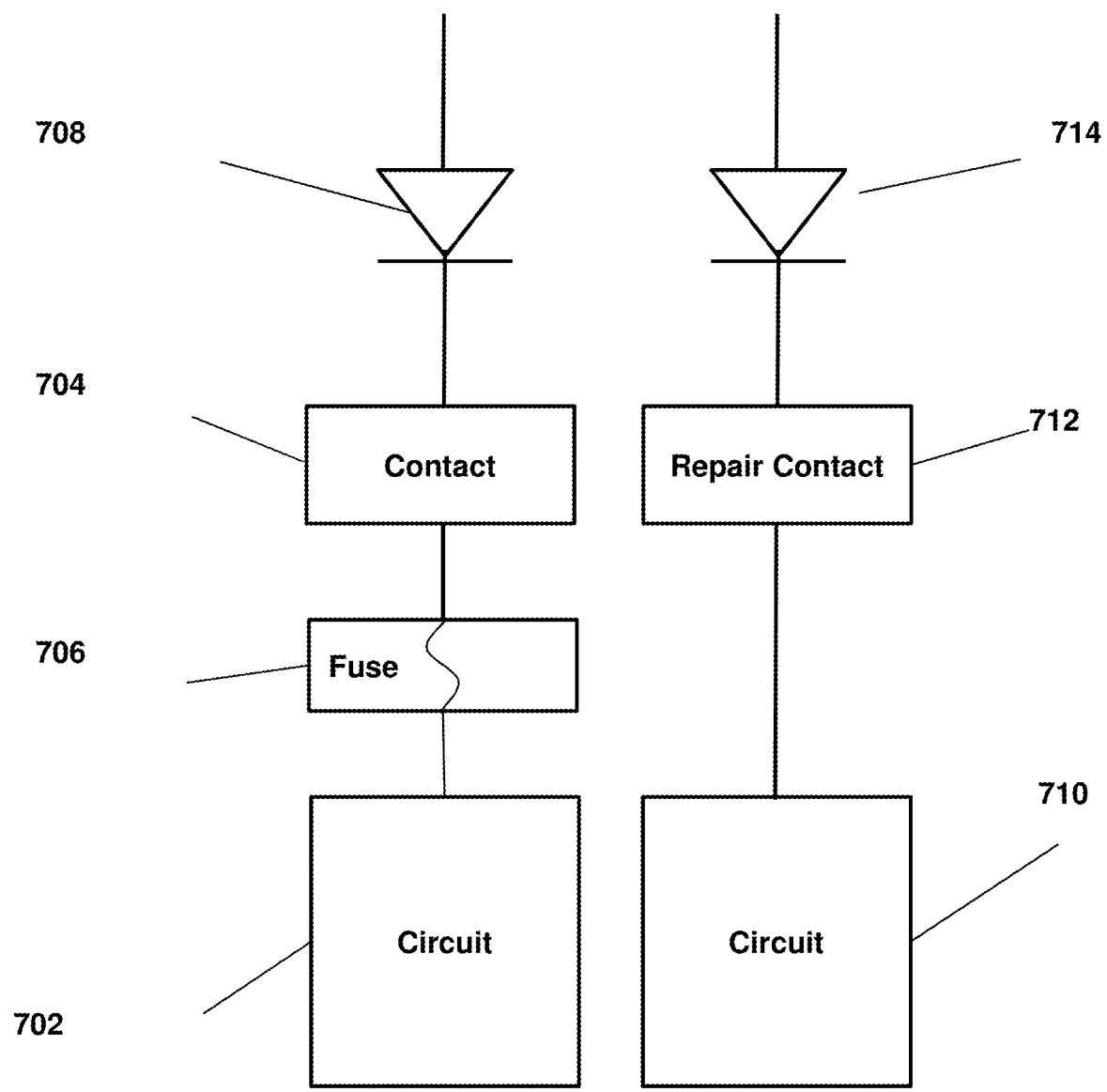
FIG. 7B shows another repair embodiments based on a spare circuit and repair pads.
Figure 7C:
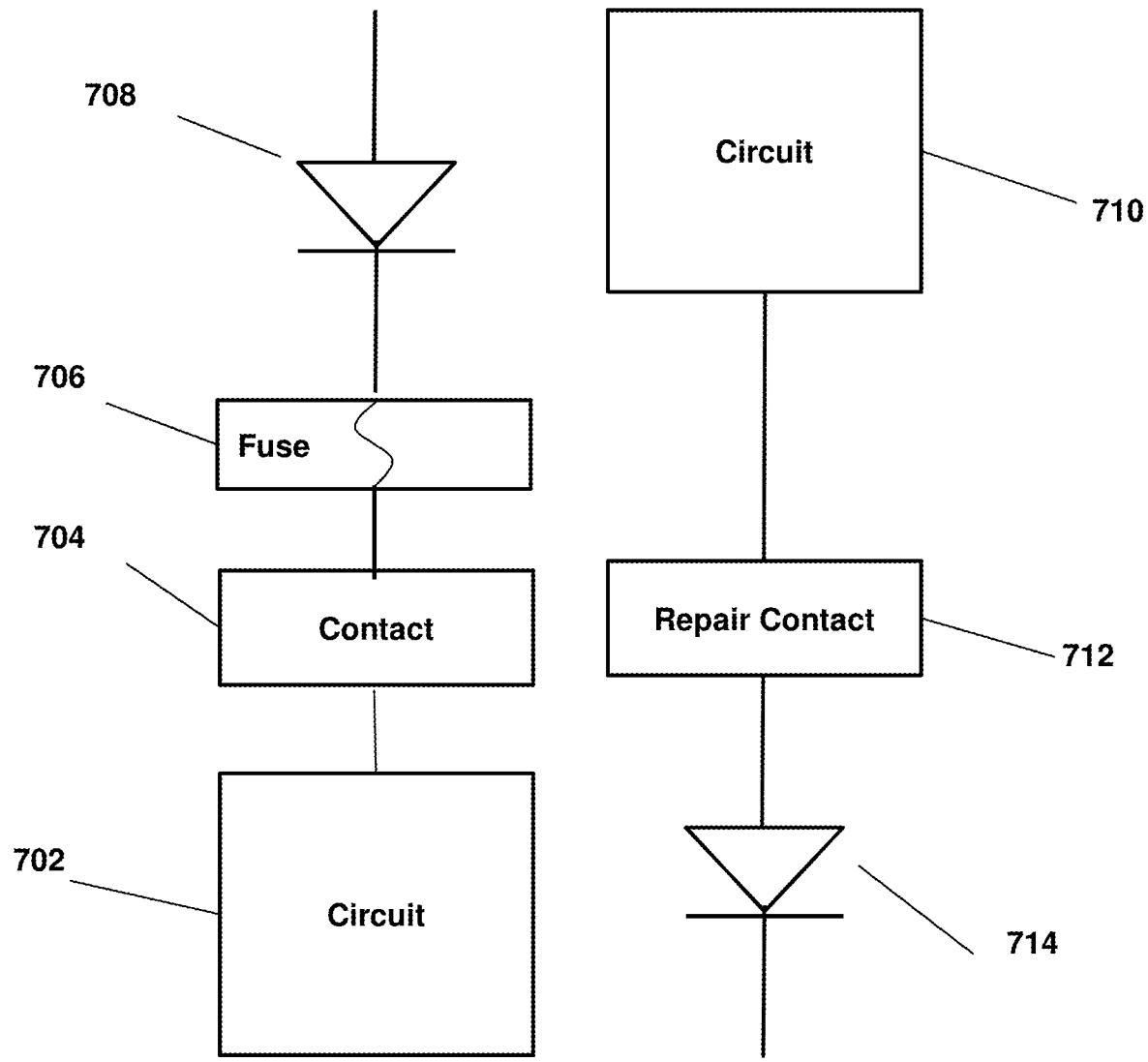
FIG. 7C shows another repair embodiments based on a spare circuit and repair pads.

In other embodiments, as illustrated in FIG. 7A, FIG. 7B, and FIG. 7C, complete spare circuits 710 with extra pads 712 are distributed across the system substrate. Here, a repair structure is described that include spare circuits 710 connected to extra (repair) pads 712 for receiving working spare (repair) devices 714 and a mechanism 706 (a generally closed fuse) for disabling the defective circuits and defective devices. Here, the extra spare circuit is populated with a micro device 714 similar to the defective device 708. Once discovered to be defective, the defective device is disconnected from the original circuit 702 by a similar fuse 706 as described above, or alternatively, one can also program this circuit to always be inactive in which case physical disconnection would not be required. Here, one can redirect the data line from the defective circuit to the spare circuit by using fuses similar to those described above. Alternatively, there can be a separate data line for the spare circuits. In one such example, the spare circuit can have a different orientation compared to that of the actual pixel circuit. As the integration process used for depositing devices into the spare circuit for repair may be different from the integration process used for the original devices, the orientation of the circuit can be switched to match the repair integration operation. For example, for repair integration, one can use a normal pick-and-place process instead of a direct selective transfer from the donor substrate. During the pick-and-place operation the device will be rotated in horizontally and so will have a different electrical orientation compared to a direct transfer of the devices to the system substrate. Therefore, circuits used for repair can be configured to accommodate the difference in electrical orientation of the device. Although the pixel circuit of FIG. 7A and FIG. 7B illustrates a defective device 708 and a new device 714 each having a particular polarity, and a particular serial order of the fuse 704 and contact 706 between the circuit 702 and defective device 708 it is to be understood that opposite polarities and orders are also contemplated. FIG. 7C shows one example of such opposite polarity that can accommodate the rotation of a repair device during the integration process. In all embodiments described here, the spare circuit can be shared among a small number of adjacent circuits. Since the rate of having multiple defective adjacent circuit is very low, one can divide the circuits into groups of small numbers of adjacent circuits and rely upon the use of one spare circuit for each group.

Figure 8:
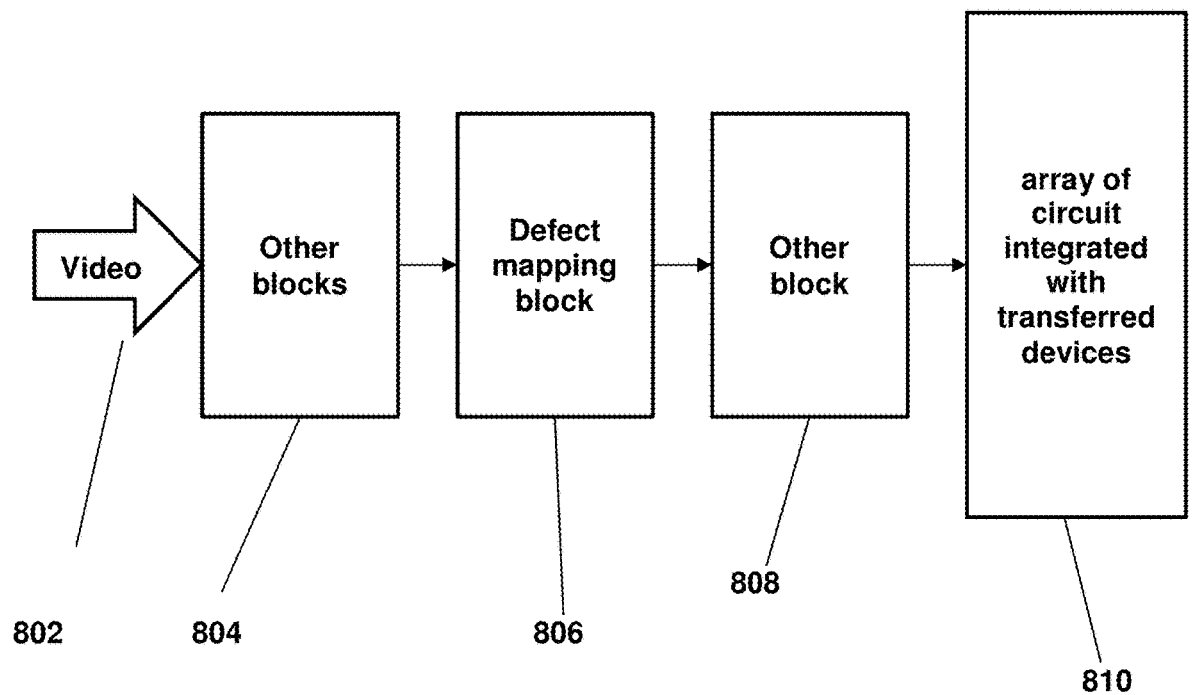
FIG. 8 demonstrate a data path block diagram for mapping the defective circuits and micro devices to repaired ones.

For some defect repair mechanisms where the display controller needs to redirect the data flow to the spare circuits, a defect mapping block 806 as illustrated in FIG. 8 is used. The video 802 (or any other input signal) comes to the controller through different interfaces. After pre-processing (such as domain conversion, scaling, color correction, image processing, etc.) using different blocks 804, the data is passed to defect mapping block 806. Defect mapping block 806 has a list of all defective circuits (including circuits once defective and now repaired) and the position of their corresponding spare circuits. In the defect mapping block 806, the data for the defective circuits are mapped to their corresponding spare circuits. In addition, the data destined for defective circuits may be set to a predefined value to keep the circuit active. After that the data can go through external compensations and correction blocks 808 and then transferred to the array 810 of circuits integrated with transferred devices which as illustrated in FIG. 8 may be a display.

Figure 9:
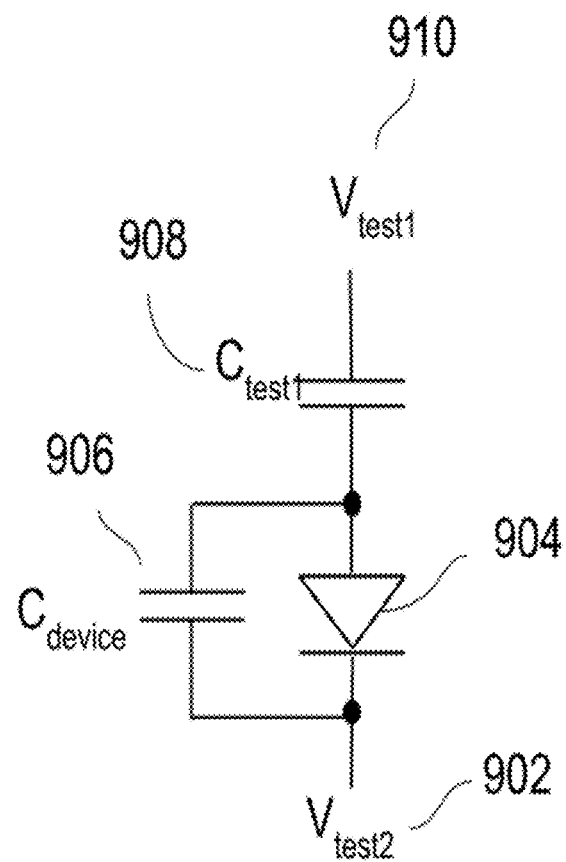
FIG. 9 shows a micro device (e.g. microLED) is couple to a test capacitor.

FIG. 9 shows an exemplary embodiment where the micro device 904 (e.g. microLED) is couple to a test capacitor 908 from one electrode and coupled to a test voltage 902 through another electrode. Where the microdevice 904 may have a device capacitance 906. Also, the test capacitor 908 may be coupled to a time varying test signal voltage (or current) 910. The time varying signal 910 can induce a complementary signal into the microdevice 904. For example, if the time varying signal is a current, it can induce a voltage or if the time varying signal is a voltage it can induce a current. The device relation between the time varying signal and complementary signal will be the function of a test capacitor 908, micro device 904 and a device parasitic capacitor 906. Also, the micro device 904 can generate another signal accordingly such as a light output (or other form of electromagnetic wave) which can be measured. The extraction of these signals can result in characterizing the microdevice 904 and identifying any possible defects by extracting and identify defects in a at least one micro device parameter such as, color point, state of device, external efficiency or any functional parameter of the device.

Figure 10:
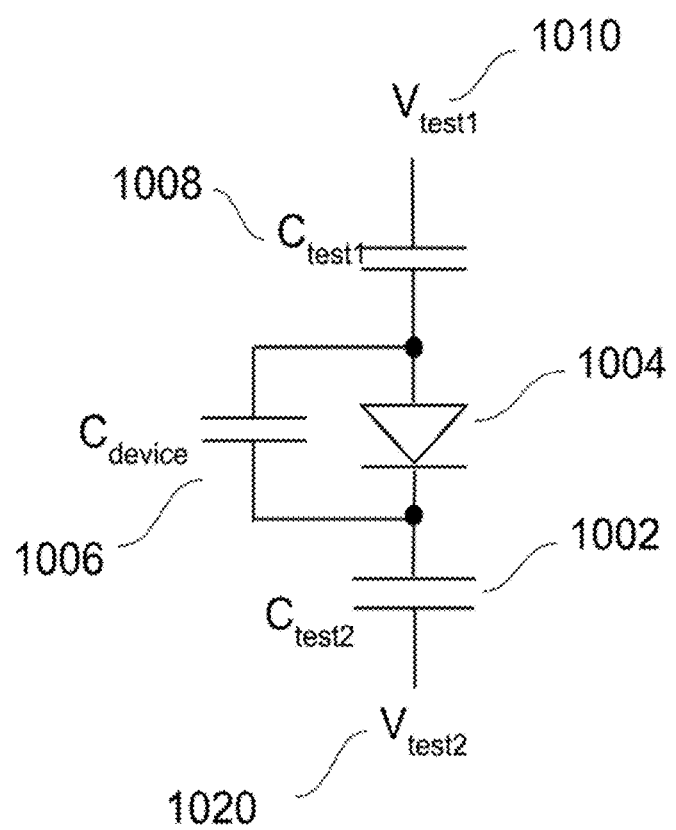
FIG. 10 shows a micro device (e.g. microLED) is couple to two test capacitors.

In some cases, it may not be possible to couple one electrode of a micro device 1004 to a test voltage directly. As demonstrated in FIG. 10, two test capacitors 1008 and 1002 can be used. Here, the time varying signals 1010 and 1020 needs to be out of phase to create complementary signal to the device 1004. For example, if the two-time varying signals 1010 1020 are voltage, the current going through the device 1004 signals will be a function of the difference between the two voltages. As a result, to maximize the current, the two-time varying signals should be 90 degree out of phase.

Figure 11:
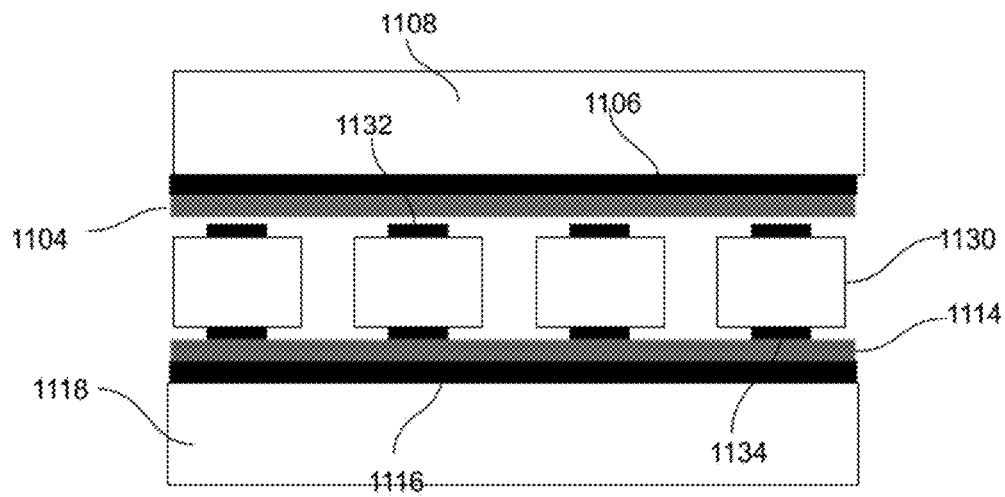
FIG. 11 shows an implementation of the two-time varying signals applied to a microdevice.

FIG. 11 shows an exemplary implementation of the two-time varying signals applied to a microdevice. In one case, the carrying substrate 1118 includes at least one electrode 1116 and a dielectric layer 1114 covering at least part of the electrode 1116. One or more microdevices 1130 are placed or formed on top of the dielectric 1114. Other layers can be used between the dielectric 1114 and microdevice 1130. The first pad 1134 of the microdevice 1130 is facing the electrode 1116 of the carrying substrate 1118. Another test substrate 1108 includes another electrode 1106 and a dielectric layer 1104. The test substrate 1108 bring close to the second pad 1132 of microdevice 1130. The electrodes 1116 and 1106 and the dielectric layers 1104 and 1114 and the microdevice 1130 pads 1132 and 1134 form the test capacitors.

Figure 12A:
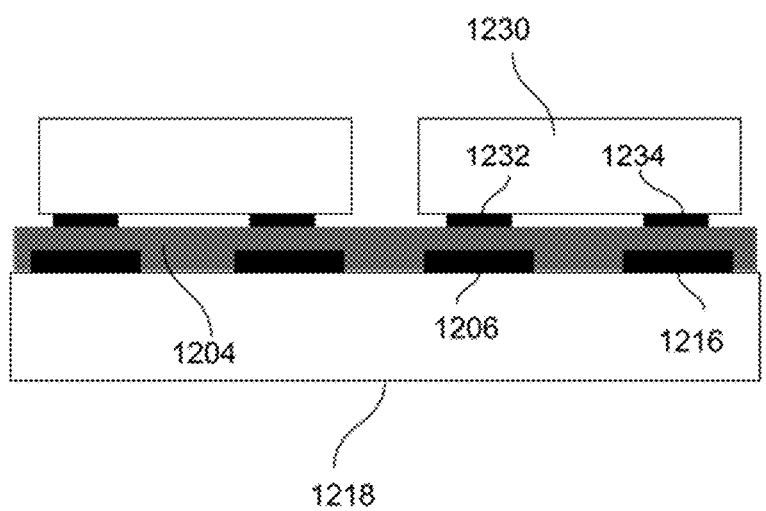
FIG. 12A shows another implementation of the two-time varying signals applied to a microdevice.

FIG. 12A shows another exemplary implementation of the two-time varying signals applied to a microdevice. In one case, the carrying substrate 1118 includes at least two electrodes 1206 and 1216 and a dielectric layer 1204 covering at least part of the electrodes 1206 and 1216. One or more microdevices 1230 are placed or formed on top of the dielectric 1204. Other layers can be used between the dielectric 1204 and microdevice 1230. The first pad 1232 of the microdevice 1230 is facing the first electrode 1206 of the carrying substrate. The second pad 1234 of the microdevice 1230 is facing the second electrode 1232 of the carrying substrate 1218. The electrodes 1206 and 1216 and the dielectric layer 1204 and the microdevice 1230 pads 1232 and 1234 form the test capacitors.

Figure 12B:
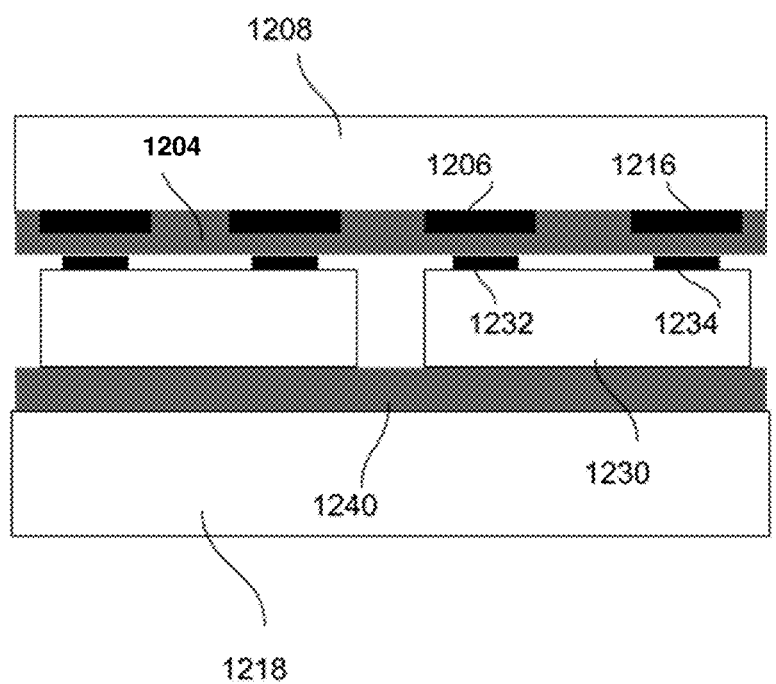
FIG. 12B shows another implementation of the two-time varying signals applied to a microdevice While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

FIG. 12B shows another exemplary implementation of the two-time varying signals applied to a microdevice. In one case, the carrying substrate 1218 includes at least two electrodes 1206 and 1216 and a dielectric layer 1204 covering at least part of the electrodes 1206 and 1216. One or microdevice 1230 are placed or formed on top of the dielectric 1204. Other layers can be used between the dielectric 1204 and microdevice 1230. The first pad 1232 of the microdevice 1230 is facing the first electrode 1206 of the carrying substrate 1218. The second pad 1234 of the microdevice 1230 is facing the second electrode 1232 of the carrying substrate 1218. The electrodes 1206 and 1216 and the dielectric layer 1204 and the microdevice 1230 pads 1232 and 1234 form the test capacitors. The other side of the microdevice is on a layer 1240 which is on the carrying substrate.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of extracting and identify defects in at least one microdevice parameter, the method comprising:
    having a carrying substrate comprising at least one electrode and a dielectric layer covering at least part of the electrode;

forming one or more microdevices on top of the dielectric;

having additional layers between the dielectric and the microdevices;

having a first pad of the microdevice facing the electrode of the carrying substrate;

having another test substrate comprising another electrode and a dielectric layer, wherein the test substrate is close to a second pad of microdevice, and forming two test capacitors with the two electrodes, the two dielectric layers and the two microdevice pads;

coupling a micro device to the two test capacitors through respective electrodes;

coupling the two test capacitors to a time varying test signals;

measuring at least one signal from the microdevice; and extracting at least one microdevice parameter.

2. The method of claim 1, wherein one of the time varying test signals is a voltage.

3. The method of claim 1, wherein the microdevice signal is one of the time varying test signals, and is a current.

4. The method of claim 1, wherein the microdevice signal is an electromagnetic signal.

5. The method of claim 1, wherein the microdevice parameter is an external efficiency.

6. The method of claim 1, where in the microdevice parameter is a color point.

7. The method of claim 1, wherein the microdevice parameter is a state of microdevice.

8. The method of claim 1, wherein the microdevice parameter is a functional parameter of the device.

9. The method of claim 1, wherein more than one microdevice parameter is extracted.

10. The method of claim 1, wherein the second and the first time varying signals are out of a phase.

11. The method of claim 10, wherein the out of phase is 90 degrees.

* * * * *